(12) United States Patent
Chikagawa

(10) Patent No.: US 8,241,449 B2
(45) Date of Patent: Aug. 14, 2012

(54) METHOD FOR PRODUCING CERAMIC BODY

(75) Inventor: Osamu Chikagawa, Yasu (JP)

(73) Assignee: Murata Manufacturing Co., Ltd., Kyoto (JP)

(*) Notice: Subject to any disclaimer, the term of this patent is extended or adjusted under 35 U.S.C. 154(b) by 24 days.

(21) Appl. No.: 12/961,530

(22) Filed: Dec. 7, 2010

(65) Prior Publication Data

US 2011/0088831 A1    Apr. 21, 2011

Related U.S. Application Data

(63) Continuation of application No. PCT/JP2009/060339, filed on Jun. 5, 2009.

(30) Foreign Application Priority Data

Jun. 13, 2008 (JP) ................................. 2008-155322

(51) Int. Cl.
*C03B 29/00* (2006.01)
*C04B 33/34* (2006.01)

(52) U.S. Cl. ................. 156/89.11; 156/89.12; 156/89.28

(58) Field of Classification Search ............... 156/89.11, 156/89.12, 89.22

See application file for complete search history.

(56) References Cited

U.S. PATENT DOCUMENTS

| | | | |
|---|---|---|---|
| 6,610,621 B2 * | 8/2003 | Masuko | 501/32 |
| 2002/0050316 A1 * | 5/2002 | Sakamoto et al. | 156/89.12 |
| 2002/0150743 A1 | 10/2002 | Sakamoto et al. | |
| 2007/0248801 A1 | 10/2007 | Nakao | |

FOREIGN PATENT DOCUMENTS

| | | |
|---|---|---|
| JP | 2554415 B2 | 11/1996 |
| JP | 2001-060767 A | 3/2001 |
| JP | 2001-085839 A | 3/2001 |
| JP | 2002-016360 A | 1/2002 |
| JP | 2002-198647 A | 7/2002 |
| JP | 2003-347730 A | 12/2003 |

(Continued)

OTHER PUBLICATIONS

Official Communication issued in International Patent Application No. PCT/JP2009/060339, mailed on Aug. 11, 2009.

(Continued)

*Primary Examiner* — Philip Tucker
*Assistant Examiner* — Alex Efta
(74) *Attorney, Agent, or Firm* — Keating & Bennett, LLP

(57) ABSTRACT

A laminated body includes, in sequence, a base layer mainly composed of a ceramic material and a glass material, a first constraining layer that is primarily made of a ceramic material that is not sintered at a temperature at which the base layer is sintered, a second constraining layer primarily made of a ceramic material and a glass material that are sintered at the temperature at which the base layer is sintered, and a third constraining layer primarily made of a ceramic material that is not sintered at the temperature at which the base layer is sintered. The laminated body is subsequently fired at the temperature at which the base layer is sintered. The first, second, and third constraining layers are removed from the fired laminated body to provide a ceramic body that is a sinter of the base layer. After the firing, adhesion between the base layer and the first constraining layer and adhesion between the second constraining layer and the first constraining layer are different from each other.

10 Claims, 11 Drawing Sheets

FOREIGN PATENT DOCUMENTS

| | | | |
|---|---|---|---|
| JP | 2006-156449 A | | 6/2006 |
| JP | 2007-081357 A | | 3/2007 |
| JP | 2007081357 A | * | 3/2007 |
| JP | 2007-165565 A | | 6/2007 |
| JP | 2008-004733 A | | 1/2008 |
| JP | 2008004733 A | * | 1/2008 |

OTHER PUBLICATIONS

Official Communication issued in corresponding German Patent Application No. 11 2009 001 448.8, mailed on Dec. 13, 2011.

* cited by examiner

METHOD FOR PRODUCING CERAMIC BODY

BACKGROUND OF THE INVENTION

1. Field of the Invention

The present invention relates to a method for producing a ceramic body such as a ceramic substrate, in particular, to a method for producing a ceramic body by a non-contraction process.

2. Description of the Related Art

In recent years, there have been ever increasing demands for reduction in size, achievement of higher accuracy, and achievement of lower cost in electronic equipment. With such demands, achievement of higher accuracy and the like have also been demanded for ceramic bodies such as ceramic substrates used for circuit boards and the like. Herein, ceramic bodies include ceramic bodies including conductors and ceramic bodies not including any conductors.

In general, a ceramic body is produced by a step of preparing a ceramic material, a step of forming ceramic green sheets, a step of laminating the ceramic green sheets, and a step of firing the resultant laminated body. The laminated body contracts in the X-Y direction (hereinafter, referred to as "plane direction") and the Z direction (hereinafter, referred to as "thickness direction") in the firing step. Variation in the contraction in the plane direction in the firing step can cause problems such as degradation in positional accuracy of external conductor patterns, which considerably affects the quality of products.

To solve such problems, the non-contraction process in which a laminated body is allowed to contract only in the thickness direction while contraction in the plane direction is suppressed is proposed in, for example, Japanese Patent No. 2554415. Specifically, referring to FIG. 12, a ceramic laminated body is produced by respectively press-bonding constraining layers 48a and 48b that constrain contraction of a base layer 40 and contain a ceramic material to one and the other main surfaces of the base layer 40, which is obtained by laminating, as necessary, ceramic green sheets that can be fired at low temperature and is to be turned into a ceramic body after firing. After that, the ceramic laminated body is fired at low temperature. After the firing, the constraining layers 48a and 48b are removed by a technique such as a supersonic oscillation technique.

According to the method described in Japanese Patent No. 2554415, since the constraining layers 48a and 48b are constituted by ceramic green sheets that are not sintered at a temperature at which the base layer 40 can be sintered, the constraining layers 48a and 48b do not substantially contract in a firing step conducted at the temperature at which the base layer 40 can be sintered. Thus, contraction of the base layer 40 in the plane direction can be suppressed and the dimensional accuracy of the resultant ceramic body can be considerably enhanced.

In recent years, among ceramic bodies, with improvement in functions of ceramic bodies and the like (hereinafter, referred to as "ceramic substrates") that include conductors for wiring or the like, there is an increasing demand for providing wiring of such ceramic substrates at higher density. Additionally, there is also a demand for embedding circuit elements such as capacitors in ceramic substrates. As a result, there is a case where the formation density of conductors or the degrees of contraction of conductors are different between one side and the other side with respect to a central plane in a ceramic substrate, the central plane being a plane in which the distance from one main surface of the ceramic substrate is equal to the distance from the other main surface of the ceramic substrate. In this case, the ceramic substrate suffers from warpage, deformation, and the like when being fired, which is problematic.

To deal with this problem, for example, Japanese Unexamined Patent Application Publication No. 2001-60767 proposes a method of suppressing warpage, deformation, and other defects of a ceramic substrate in a firing step by making the thicknesses of constraining layers provided on the main surfaces of the ceramic substrate different from each other. According to this method, contraction of a ceramic substrate in the plane direction can be prevented while warpage, deformation, and other defects of the ceramic substrate can be also prevented.

In this manner, in the non-contraction process, by utilizing the thicknesses of the constraining layers, a constraining force in the plane direction to prevent warpage, deformation, and other defects of the ceramic substrate in a firing step is improved.

However, the above-described method utilizing the thicknesses of constraining layers does not solve a problem with respect to the removal of constraining layers. Specifically, a the thicknesses of constraining layers increase, the amount of the constraining layers to be removed by a technique such as the above-described supersonic oscillation technique is increased, and a greater amount of time is required to remove the constraining layers.

SUMMARY OF THE INVENTION

To overcome the problems described above, preferred embodiments of the present invention provide a method for producing a ceramic body in which constraining layers can be readily removed even when the constraining layers have relatively large thicknesses in order to improve the constraining force.

A method for producing a ceramic body according to a preferred embodiment of the present invention includes a step of preparing a laminated body including, in sequence, a base layer primarily made of a ceramic material and a glass material, a first constraining layer that is in contact with at least one main surface of the base layer and is primarily made of a ceramic material that is not sintered at a temperature at which the base layer is sintered, a second constraining layer primarily made of a ceramic material and a glass material that are sintered at the temperature at which the base layer is sintered, and a third constraining layer primarily made of a ceramic material that is not sintered at the temperature at which the base layer is sintered, a step of firing the laminated body at the temperature at which the base layer is sintered, and a step of removing the first, second, and third constraining layers from the fired laminated body to provide a sintered ceramic body, wherein, after the firing, adhesion between the base layer and the first constraining layer and adhesion between the second constraining layer and the first constraining layer are different from each other.

As a result of the step of firing the laminated body, reaction layers are formed at an interface between the base layer and the first constraining layer and at an interface between the second constraining layer and the first constraining layer. A thickness of the reaction layer formed at the interface between the base layer and the first constraining layer and a thickness of the reaction layer formed at the interface between the second constraining layer and the first constraining layer are preferably different from each other.

A content of the glass material in the base layer and a content of the glass material in the second constraining layer are preferably different from each other.

A particle diameter of the ceramic material in the base layer and a particle diameter of the ceramic material in the second constraining layer are preferably different from each other.

A softening point of the glass material in the base layer and a softening point of the glass material in the second constraining layer are preferably different from each other.

The glass materials of the base layer and the second constraining layer preferably include silica, for example, and a silica content of the glass material in the base layer and a silica content of the glass material in the second constraining layer are preferably different from each other.

At least one of the base layer and the second constraining layer preferably includes a conductor. In this case, the conductor preferably includes silver, for example.

The step of removing the first, second, and third constraining layers preferably includes a step of simultaneously removing at least the second and third constraining layers.

A method for producing a ceramic body according to a preferred embodiment of the present invention is advantageously conducted when the ceramic body is a ceramic substrate.

According to a method for producing a ceramic body according to various preferred embodiments of the present invention, since the base layer is primarily made of a ceramic material and a glass material, as a result of firing, the glass material permeates from the base layer to the first constraining layer, and the base layer and the first constraining layer are bonded to each other. Since the second constraining layer is also primarily made of a ceramic material and a glass material, as a result of firing, the glass material permeates from the second constraining layer to the first constraining layer, and the second constraining layer and the first constraining layer are bonded to each other. After firing, the second constraining layer is sintered, and adhesion between the base layer and the first constraining layer and adhesion between the second constraining layer and the first constraining layer are different from each other. As a result, the second constraining layer can be readily removed and, thus, all of the first, second, and third constraining layers can be readily removed. Therefore, according to a method for producing a ceramic body according to various preferred embodiments of the present invention, even when the total thickness of the first, second, and third constraining layers is increased for enhancing constraining force, removal of these constraining layers does not take a long period of time.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
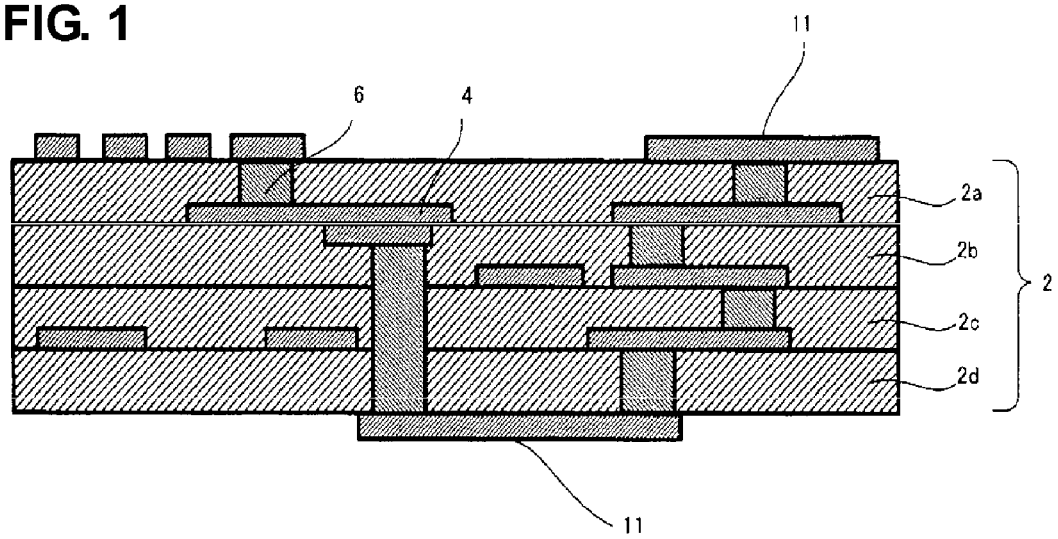
FIG. 1 is a sectional view of a ceramic substrate produced by a method for producing a ceramic body according to a first preferred embodiment of the present invention.

Referring to FIG. 1, a ceramic substrate 2 as an example of a ceramic body produced by various preferred embodiments of the present invention will be described.

The ceramic substrate 2 includes the laminated body including ceramic layers 2a, 2b, 2c, and 2d that are preferably made of a low temperature sintering ceramic material, for example. The ceramic substrate 2 includes conductors such as internal conductors 4 and 6 and external conductors 11. The internal conductors 4 and 6 include in-plane conductors 4 arranged along the interfaces between the ceramic layers 2a to 2d, and interlayer connection conductors 6 arranged so as to penetrate the ceramic layers 2a to 2d in the thickness direction. The external conductors 11 are preferably used to establish connection with surface-mount components when the surface-mount components are mounted on an external surface of the ceramic substrate 2. The external conductors 11 are also preferably used to establishing connection with a mother board, such as a printed circuit board (not shown).

Figure 2:
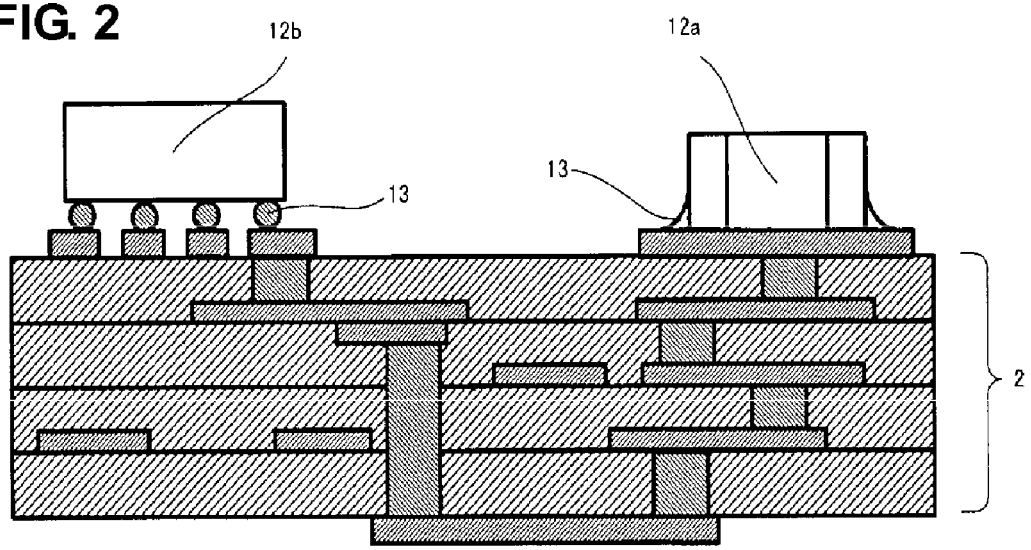
FIG. 2 is a sectional view of the ceramic substrate in FIG. 1 on which surface-mount components are mounted.

Referring to FIG. 2, for example, a passive element 12a, such as a chip-type monolithic ceramic capacitor, and an active element 12b, such as a semiconductor device, for example, are preferably mounted on the ceramic substrate 2. The passive element 12a and the active element 12b are electrically connected to the ceramic substrate 2 via electrically conductive bonding members 13 preferably made of solder or other bonding material, for example.

A ceramic body produced by various preferred embodiments of the present invention is not restricted to the ceramic substrate shown in FIG. 1. Hereinafter, a method for producing a ceramic body will be described with reference to a method for producing a ceramic substrate.

A method for producing a ceramic body according to a first preferred embodiment of the present invention will be described with reference to FIGS. 3 to 8.

(1) Step of Preparing Laminated Body

Figure 3:
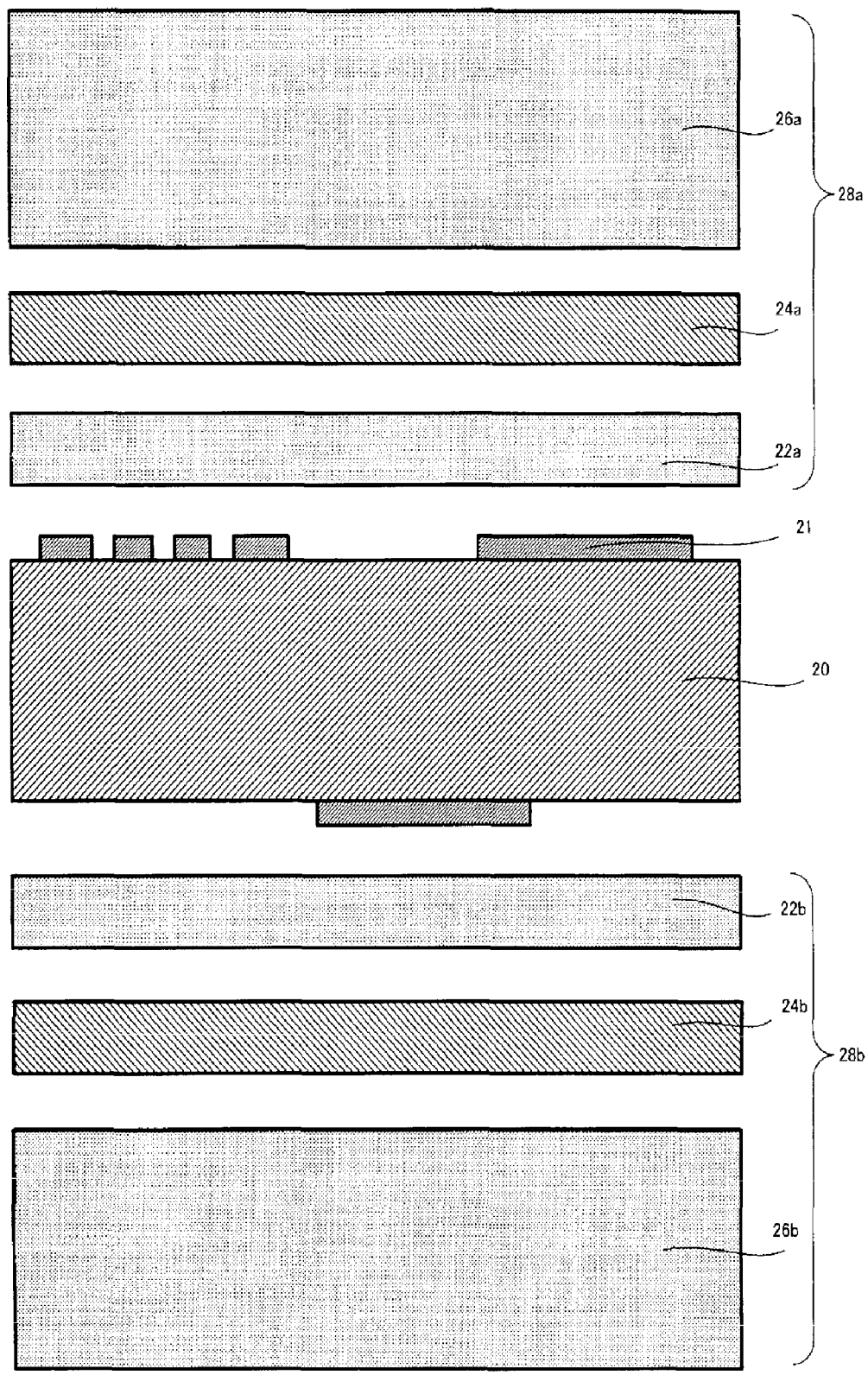
FIG. 3 is a schematic sectional view of a base layer and constraining layers used to produce the ceramic body in FIG. 1.

Referring to FIG. 3, a base layer 20, first constraining layers 22a and 22b, second constraining layers 24a and 24b, and third constraining layers 26a and 26b are prepared. In the following description, the first constraining layer 22a, the second constraining layer 24a, and the third constraining layer 26a are collectively referred to as a constraining layer assembly 28a, and the first constraining layer 22b, the second constraining layer 24b, and the third constraining layer 26b are collectively referred to as a constraining layer assembly 28b.

The first constraining layers 22a and 22b are provided primarily to prevent contraction of the base layer 20 in the plane direction. The second constraining layers 24a and 24b are provided primarily to facilitate removal of the constraining layer assemblies 28a and 28b after firing. The third constraining layers 26a and 26b are provided primarily to prevent warpage, deformation, and other defects of the base layer 20.

The second constraining layers 24a, 24b provide the constraining effect by being sandwiched between the first constraining layers 22a, 22b and the third constraining layers 26a, 26b. The third constraining layers 26a, 26b provide the constraining effect to the base layer 20 through the second constraining layers 24a, 24b and the first constraining layers 22a, 22b. In this manner, the first, second, and third constraining layers together function to prevent contraction of the base layer 20 in the plane direction, warpage, deformation, and other detects of the base layer 20 in the firing step.

To facilitate removal of the constraining layer assemblies 28a and 28b described below, the first constraining layers 22a and 22b are preferably formed so as to be thinner than the third constraining layers 26a and 26b. To enhance constraining force, the third constraining layers 26a and 26b are preferably formed so as to be thicker than the first constraining layers 22a and 22b. For example, when the first, second, and third constraining layers are constituted by laminated bodies each including a plurality of sheets, the thickness of each constraining layer can be adjusted by changing the number of the sheets laminated.

For example, the base layer 20 preferably has a thickness of about 300 μm, the first constraining layers 22a and 22b preferably have a thickness of about 50 μm, the second constraining layers 24a and 24b preferably have a thickness of about 50 μm, and the third constraining layers 26a and 26b preferably have a thickness of about 300 μm.

A constraining layer should be arranged so as to be in contact with at least one main surface of the base layer 20. However, to uniformly exert constraining force on the both surfaces of the base layer 20, the constraining layer assemblies 28a and 28b are preferably provided on the main surfaces of the base layer 20 as shown in FIG. 3.

A method for forming the base layer 20 will be described. To form the base layer 20, a ceramic slurry is prepared by adding a binder, a dispersing agent, a plasticizer, an organic solvent, and other components in appropriate amounts to a powder mixture of a ceramic material and a glass material and by mixing the resultant mixture.

Various ceramic materials may be used for the ceramic material. However, a preferred example of the ceramic material is alumina powder.

Various glass materials may be used for the glass material. However, a preferred example of the glass material is borosilicate glass powder.

The ceramic slurry is then formed into sheets by a method, such as a doctor blade method, for example, to thereby prepare ceramic green sheets for the base layer.

The ceramic green sheets for the base layer are preferably green sheets primarily made of a low temperature sintering ceramic material, for example. Herein, the low temperature sintering ceramic material is a ceramic material that can be sintered at a temperature of about 1050° C. or less and can be co-fired with silver or copper having low resistivity. Specific examples of such a low temperature sintering ceramic material include a glass composite type low temperature sintering ceramic material obtained by mixing a ceramic powder of alumina, forsterite, or other suitable ceramic powder with borosilicate glass, and a crystallized glass type low temperature sintering ceramic material including $ZnO$—$MgO$—$Al_2O_3$—$SiO_2$-based crystallized glass.

Holes for interlayer connection conductors are formed as necessary in the resultant ceramic green sheets, the holes being used to form interlayer connection conductors. The holes for interlayer connection conductors are preferably filled with electrically conductive paste or electrically conductive powder, for example, to thereby form unfired interlayer connection conductors. Electrically conductive paste is preferably screen printed, for example, on ceramic green sheets as necessary to thereby form unfired in-plane conductors or unfired external conductors. FIG. 3 illustrates the external conductors 21 formed on the base layer 20. FIG. 1 illustrates examples of the interlayer connection conductors 6, the in-plane conductors 4, and the external conductors 11.

An electrically conductive material included in the electrically conductive paste or an electrically conductive material defining the electrically conductive powder may preferably be a metal having a low melting point and a low resistivity, such as Ag, an Ag—Pt alloy, an Ag—Pd alloy, Cu, or Au, for example.

A method for forming the first constraining layers 22a and 22b will be described. To form the first constraining layers 22a and 22b, a ceramic slurry is prepared by adding a binder, a dispersing agent, a plasticizer, an organic solvent, and other components in appropriate amounts to a ceramic material, such as alumina powder, for example, that is not substantially sintered at the firing temperature of the base layer 20 and by mixing the resultant mixture.

Alumina powder is easily obtained so as to have stable properties and stable characteristics and is not sintered at a temperature at which the base layer can be sintered. Thus, alumina powder satisfies desirable requirements for a ceramic material to exert constraining force.

A ceramic material for forming the first constraining layers 22a and 22b is sufficient as long as the ceramic material is not substantially sintered in the step of firing the base layer 20. In addition to alumina, various ceramic materials, such as zirconia or magnesia, for example, may be used as the ceramic material. Note that, to make glass present in a large amount at and around the boundaries between the base layer 20 and the first constraining layers 22a, 22b, there is preferably an affinity to some extent between the base layer 20 and the first constraining layers 22a, 22b, and glass in the surface layers of the base layer 20 preferably wets the first constraining layers 22a and 22b to an appropriate degree at the boundaries at which the surface layers of the base layer 20 and the first constraining layers 22a, 22b are in contact with each other. For this reason, a ceramic material used to form the first constraining layers 22a and 22b is preferably the same type of ceramic material as a ceramic material used to form the base layer 20.

The ceramic slurry is then formed into sheets to thereby prepare ceramic green sheets for the first constraining layers. These ceramic green sheets are laminated to form the first constraining layers 22a and 22b.

As described below, the thicknesses of the constraining layer assemblies 28a, 28b arranged to improve constraining force can be adjusted with the third constraining layers 26a, 26b that can be easily removed. For this reason, to facilitate removal of the first constraining layers 22a and 22b after firing, the first constraining layers 22a, 22b are preferably thinner than the third constraining layers 26a, 26b.

A method for forming the second constraining layers 24a and 24b will now be described. To form the second constraining layers 24a and 24b, a ceramic slurry is prepared by adding a binder, a dispersing agent, a plasticizer, an organic solvent, and other components in appropriate amounts to a powder mixture of a ceramic material and a glass material and by mixing the resultant mixture.

Various ceramic materials may be used for the ceramic material. However, a preferred example of the ceramic material is alumina powder.

Various glass materials may be used for the glass material. However, a preferred example of the glass material is borosilicate glass powder.

The ceramic slurry is then formed into sheets to thereby prepare ceramic green sheets for the second constraining layers. These ceramic green sheets are laminated to form the second constraining layers 24a and 24b.

The second constraining layers 24a and 24b are preferably formed so as to be relatively thin such that contraction in the plane direction, warpage, deformation, and other defects of the second constraining layers 24a, 24b can be prevented by the first constraining layers 22a, 22b and the third constraining layers 26a, 26b. This is because removal of the constraining layer assemblies can be facilitated even when the second constraining layers 24a and 24b are formed as thin layers.

A method for forming the third constraining layers 26a and 26b will now be described. The third constraining layers 26a and 26b are formed in a similar manner to that in which the first constraining layers 22a and 22b are formed. As described below, since the third constraining layers 26a and 26b can be readily removed, to improve constraining force, the third constraining layers 26a, 26b are preferably made thicker than the first constraining layers 22a, 22b by laminating relatively large number of green sheets.

Figure 4:
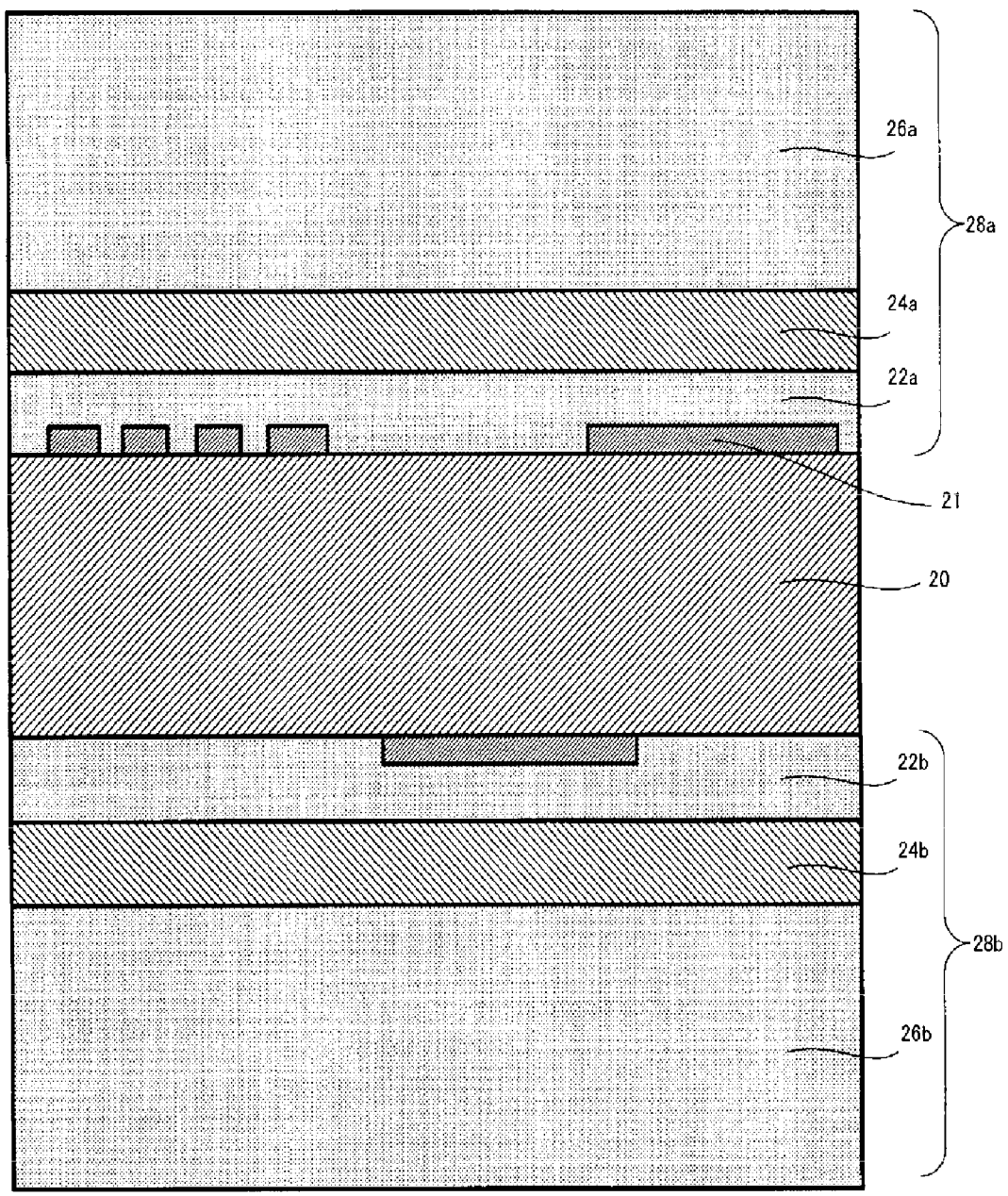
FIG. 4 is a schematic sectional view of a laminated body obtained by laminating the base layer and the constraining layers illustrated in FIG. 3.

Referring to FIG. 4, the base layer 20, the first constraining layers 22a, 22b, the second constraining layers 24a, 24b, and the third constraining layers 26a, 26b are preferably laminated in this order and press-bonded together by pressing at a pressure of, for example, about 5 MPa to about 200 MPa by a method such as isostatic pressing. As a result, an unfired laminated body having a configuration in which the constraining layer assemblies 28a and 28b are arranged so as to sandwich the base layer 20 is prepared.

Note that, in the first preferred embodiment, the external conductors 21 are preferably formed only on the base layer 20.

(2) Step of Firing Laminated Body

The laminated body is then fired at a temperature at which the base layer 20 is sintered. The firing temperature of the base layer 20 is preferably, when the base layer 20 is made of a low temperature sintering ceramic material, about 1050° C. or less, for example, and more preferably about 800° C. to about 1050° C. The firing temperature may preferably be a temperature at which the base layer 20 is sintered or greater as long as the firing temperature is less than the temperature at which the first constraining layers 22a and 22b and the third constraining layers 26a and 26b are sintered. The firing may preferably be performed while the laminated body is subjected to a constant pressure in the vertical direction. Alternatively, the firing may be performed while no pressure is applied to the laminated body.

As a result of the firing, the glass material of the base layer 20 permeates the first constraining layers 22a and 22b to thereby form reaction layers at the interfaces between the base layer 20 and the first constraining layers 22a, 22b. Thus, the base layer 20 is bonded to the first constraining layers 22a and 22b. Since the second constraining layers 24a and 24b also include a glass material, reaction layers are also formed at the interfaces between the second constraining layers 24a, 24b and the first constraining layers 22a, 22b and at the interfaces between the second constraining layers 24a, 24b and the third constraining layers 26a, 26b. Thus, the second constraining layers 24a and 24b are respectively bonded to the first constraining layers 22a and 22b. The second constraining layers 24a and 24b are respectively bonded to the third constraining layers 26a and 26b.

Since the first constraining layers 22a and 22b are not substantially sintered at a temperature at which the base layer 20 is sintered, the first constraining layers 22a and 22b do not substantially contract during the firing. For this reason, contraction in the plane direction is substantially suppressed in the base layer 20 to which the first constraining layers 22a and 22b are bonded. As a result, positional accuracy of the external conductors 21 is maintained.

Although the second constraining layers 24a and 24b are sintered preferably at a temperature at which the base layer is sintered, since the second constraining layers 24a, 24b are bonded to the first constraining layers 22a, 22b and the third constraining layers 26a, 26b, contraction of the second constraining layers 24a and 24b in the plane direction is substantially prevented and the second constraining layers 24a and 24b contracts only in the thickness direction. Thus, by being sandwiched by the first constraining layers 22a, 22b and the third constraining layers 26a, 26b, the second constraining layers 24a, 24b substantially provides the constraining effect.

Since the third constraining layers 26a and 26b are not substantially sintered at a temperature at which the base layer 20 is sintered, the third constraining layers 26a and 26b do not substantially contract by the firing. Since the third constraining layers 26a, 26b are bonded to the second constraining layers 24a, 24b, the third constraining layers 26a, 26b constrain the base layer 20 through the second constraining layers 24a, 24b and the first constraining layers 22a, 22b to thereby prevent warpage, deformation, and other defects of the base layer 20.

Figure 5:
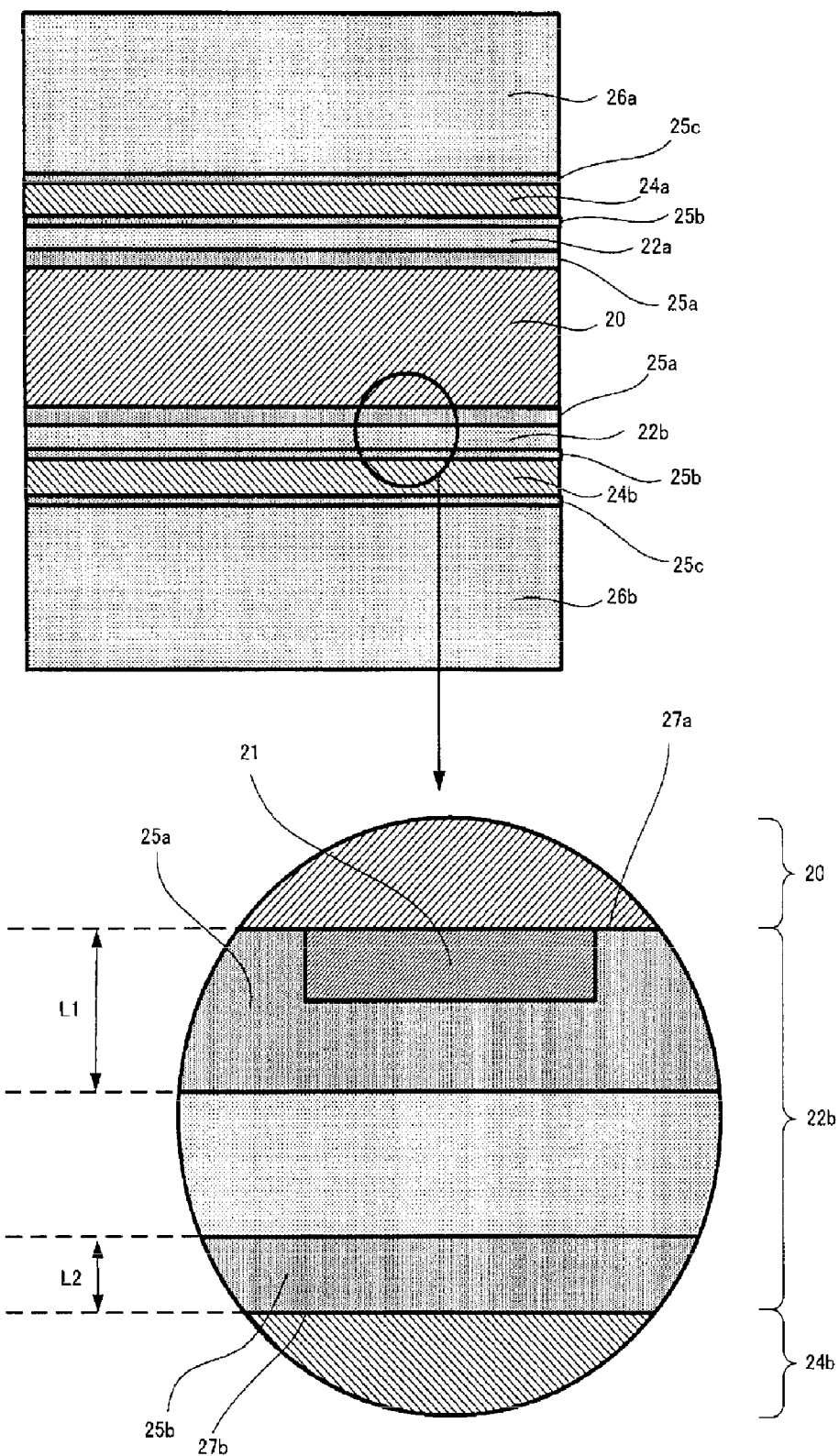
FIG. 5 is a schematic sectional view of the laminated body illustrated in FIG. 4 after firing and an enlarged sectional view of the base layer, a first constraining layer, and a second constraining layer.

FIG. 5 illustrates a schematic sectional view of a fired laminated body and an enlarged sectional view of a portion of the fired laminated body, that is, the base layer 20, the first constraining layer 22b, and the second constraining layer 24b.

In a method for producing a ceramic body according to a preferred embodiment of the present invention, the following configuration is required. After the firing, the adhesion between the base layer 20 and the first constraining layers 22a, 22b and the adhesion between the second constraining layers 24a, 24b and the first constraining layers 22a, 22b are different from each other.

Herein, adhesion is the strength with which a layer and another layer are bonded to each other. When adhesion is high, a layer and another layer are bonded to each other with a high strength and the other layer is relatively less likely to be separated from the layer. When adhesion is low, a layer and another layer are bonded to each other with a low strength and the other layer is relatively likely to be separated from the layer.

Referring to FIG. 5, to provide the above-described configuration, in the first preferred embodiment, the firing is conducted such that a thickness L1 of a reaction layer 25a formed at an interface 27a between the base layer 20 and the first constraining layer 22b is preferably different from a thickness L2 of a reaction layer 25b formed at an interface 27b between the second constraining layer 24b and the first constraining layer 22b. Reaction layers 25c are also formed at the interfaces between the second constraining layers 24a, 24b and the third constraining layers 26a, 26b.

Specifically, the external conductors 21 are provided on the base layer 20 and no external conductors are provided on the second constraining layer 24b. In general, when conductors are provided, metal materials included in the conductors diffuse during firing to thereby decrease the softening points of glass materials. Accordingly, when diffusion of a metal material included in the external conductors 21 into the base layer 20 decreases the softening point of the glass material of the base layer 20, permeation of the glass material from the base layer 20 to the first constraining layer 22b begins at an early stage.

For this reason, when the glass material of each layer is identical, the amount of the glass material that permeates from the base layer 20 having the external conductors 21 to the first constraining layer 22b is greater than the amount of the glass material that permeates from the second constraining layer 24b without an external conductor to the first constraining layer 22b. As a result, the thickness L1 of the reaction layer 25a formed by firing at the interface 27a between the base layer and the first constraining layer 22b is greater than the thickness L2 of the reaction layer 25b formed at the interface 27b between the second constraining layer 24b and the first constraining layer 22b. In this case, after the firing, the adhesion between the base layer 20 and the first constraining layer 22b is greater than the adhesion between the second constraining layer 24b and the first constraining layer 22b.

The external conductors 21 preferably include silver, for example, because silver is likely to diffuse.

Note that FIG. 5 illustrates the reaction layers 25a and 25b as a model and, in actuality, boundaries between the reaction layers and other layers are not clearly defined.

(3) Step of Removing First, Second, and Third Constraining Layers from Laminated Body The first, second, and third constraining layers are subsequently removed from the fired laminated body.

Figure 6:
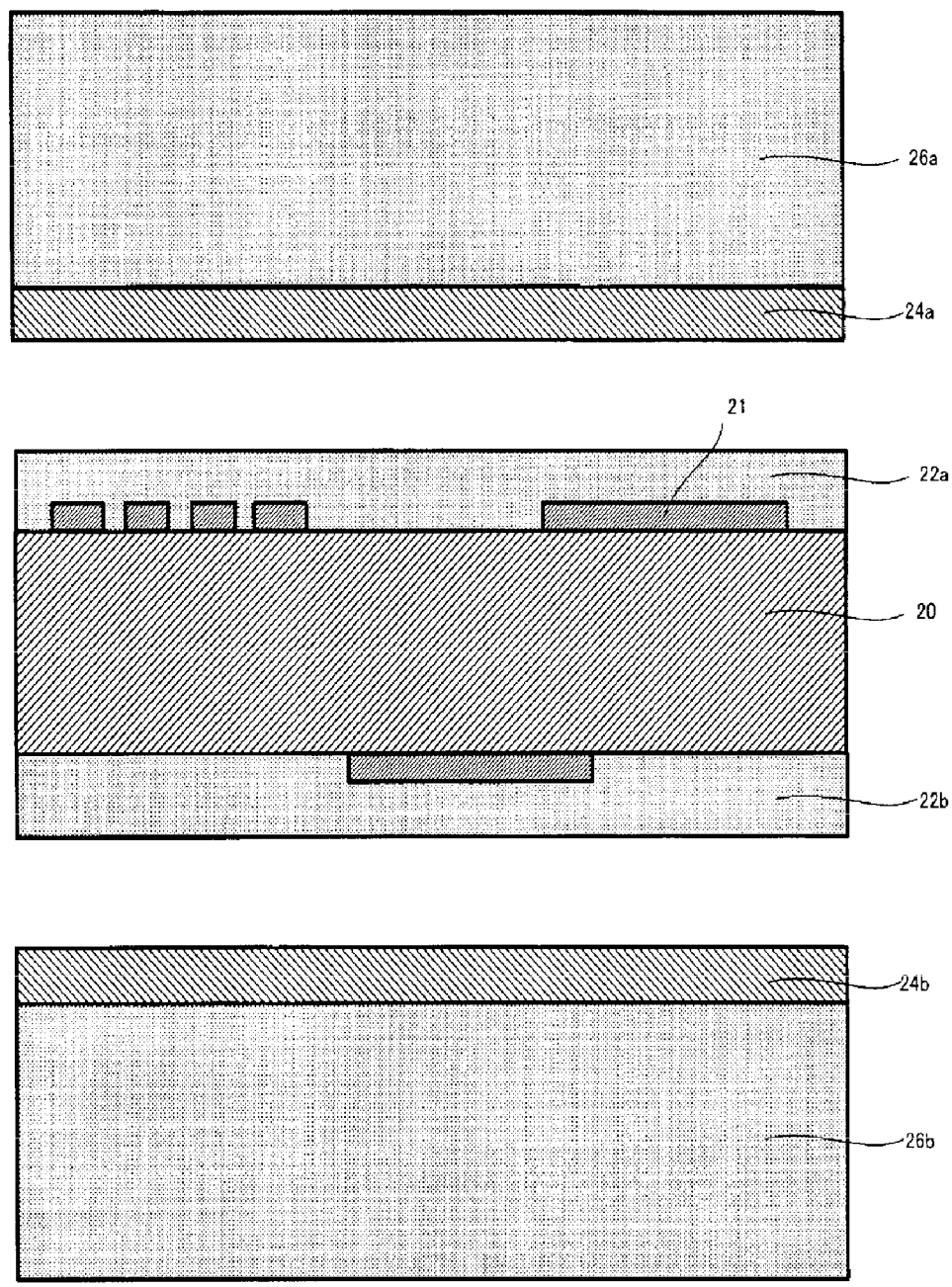
FIG. 6 is a schematic sectional view illustrating a step of removing constraining layers from the fired laminated body illustrated in FIG. 5.

Referring to FIG. 6, in the first preferred embodiment, the second constraining layers 24a, 24b and the third constraining layers 26a, 26b can be easily stripped off. As a result, only the first constraining layers 22a and 22b must be removed by a removal method described below, which decreases the time required to remove all of the constraining layers.

The second constraining layers 24a, 24b and the third constraining layers 26a, 26b can be easily stripped off because the second constraining layers 24a and 24b have been sintered after the firing, and, after the firing, the adhesion between the second constraining layers 24a, 24b and the first constraining layers 22a, 22b is less than the adhesion between the base layer 20 and the first constraining layers 22a, 22b.

Since the second constraining layers 24a, 24b and the third constraining layers 26a, 26b are bonded to each other as a result of permeation of the glass materials of the second constraining layers 24a and 24b into the third constraining layers 26a and 26b, the second constraining layers 24a, 24b and the third constraining layers 26a, 26b can be removed at the same time.

When, after the firing, the adhesion between the base layer 20 and the first constraining layers 22a, 22b is much greater than the adhesion between the second constraining layers 24a, 24b and the first constraining layers 22a, 22b, there may be a case in which the second constraining layers 24a, 24b and the third constraining layers 26a, 26b are stripped off after the firing. In this case, the step of removing the second constraining layers 24a, 24b and the third constraining layers 26a, 26b is eliminated, which further reduces the time required to remove the constraining layers.

To make the adhesion between the base layer 20 and the first constraining layers 22a, 22b much greater than the adhesion between the second constraining layers 24a, 24b and the first constraining layers 22a, 22b after the firing as described above, the base layer 20 preferably includes a conductor and conditions described below are preferably satisfied, for example, the silica content of the glass material of the base layer 20 is less than the silica contents of the glass materials of the second constraining layers 24a and 24b.

The first constraining layers 22a and 22b that remain on the base layer 20 are subsequently removed.

Figure 7:
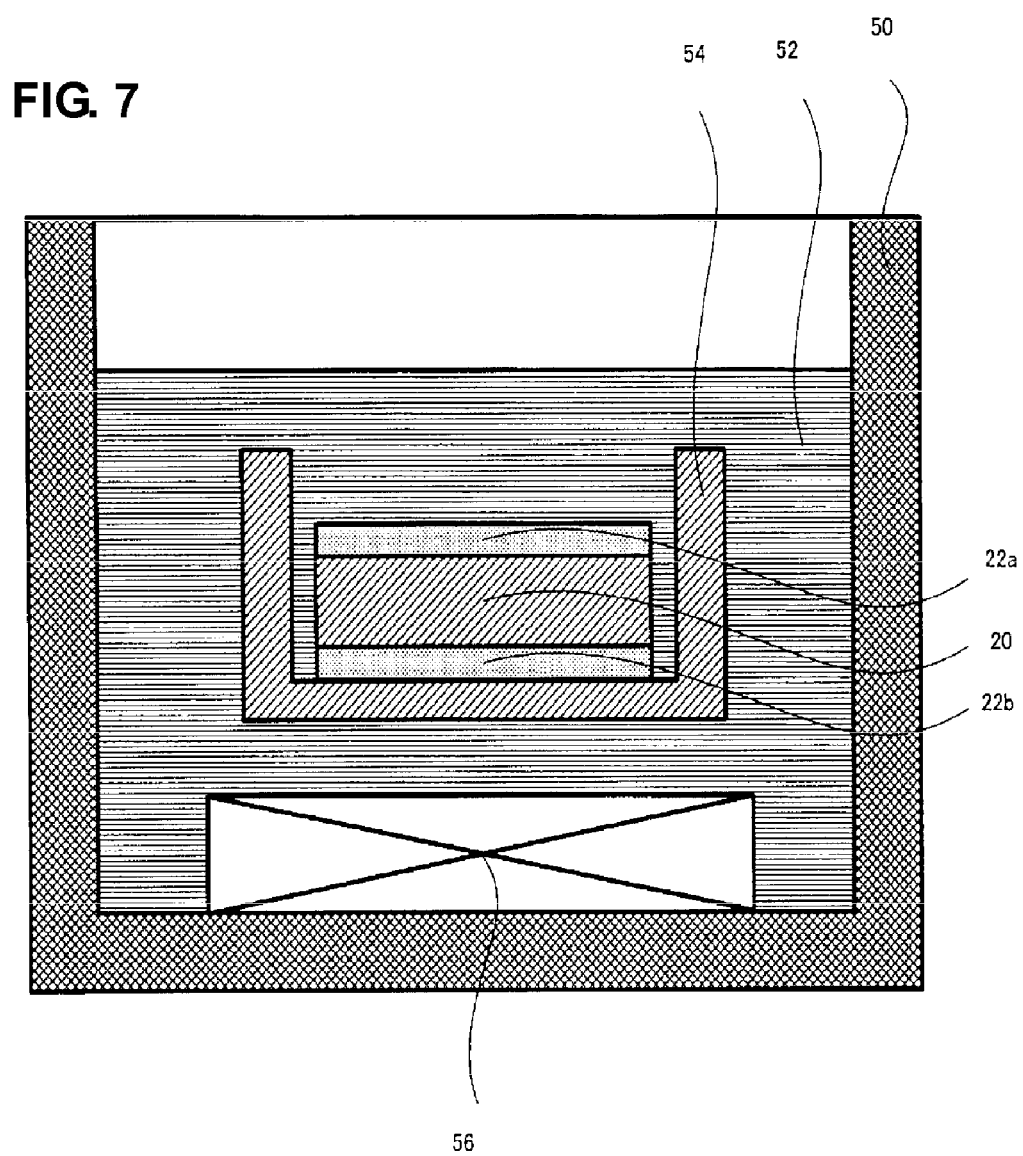
FIG. 7 is a sectional view illustrating a first specific example of performing the step of removing constraining layer as illustrated in FIG. 6.
Figure 8:
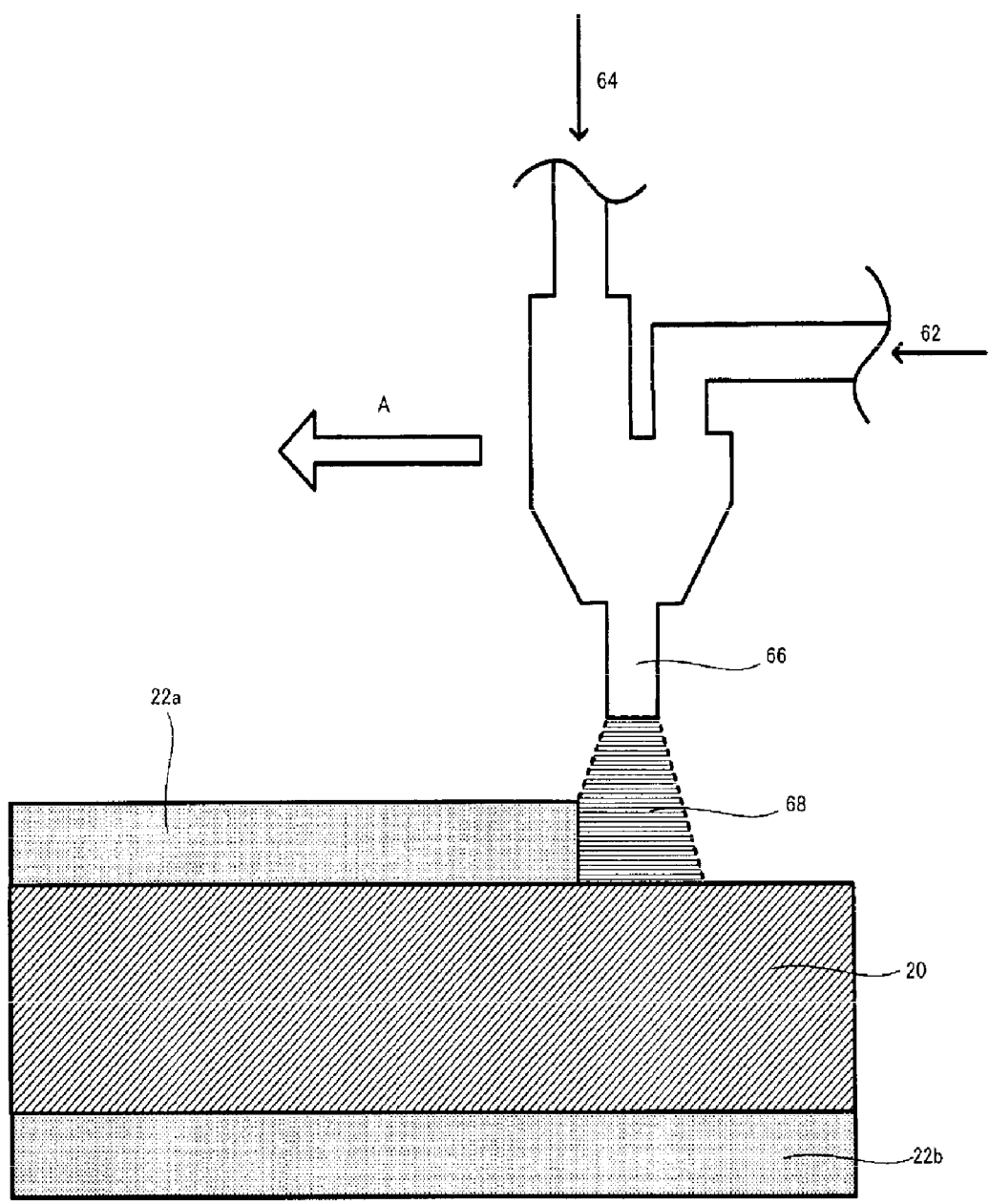
FIG. 8 is a sectional view illustrating a second specific example of conducting the step of removing constraining layers as illustrated in FIG. 6.

The first constraining layers 22a and 22b can preferably be removed by, for example, the following methods. FIGS. 7 and 8 schematically illustrate steps of two methods for removing the first constraining layers 22a and 22b. Note that, in FIGS. 7 and 8, the external conductors provided on the base layer 20 are not shown.

A first method of removing the first constraining layers 22a and 22b uses ultrasonic radiation.

Referring to FIG. 7, a cleaning solution 52 is poured into a cleaning bath 50 and the fired laminated body to be cleaned is put into a cleaning basket 54 in the cleaning bath 50. Ultrasonic waves are then radiated in the cleaning solution 52 with an ultrasonic radiator 56 to thereby remove the first constraining layers 22a and 22b.

The first constraining layers 22a and 22b are removed by this method to thereby provide a ceramic body defined by the sintered base layer 20. Thus, a ceramic substrate is produced.

A second method of removing the first constraining layers 22a and 22b uses a blast nozzle with which water or water and abrasive grains are sprayed together with compressed air.

Referring to FIG. 8, an ejection material 68 preferably including a mixture of water 62 and compressed air 64, for example, are accelerated and sprayed onto the first constraining layer 22a of the laminated body from a nozzle 66, which is an ejection port of the blast nozzle. Alternatively, the ejection material 68 may include a mixture of water into which abrasive grains are dispersed in advance and compressed air.

By continuously spraying the ejection material 68 while the nozzle 66 is sequentially moved in the direction indicated by arrow A in FIG. 8, the first constraining layer 22a is gradually removed as a result of the physical effect of water and compressed air or water into which abrasive grains are dispersed and compressed air. Both of the main surfaces of the fired laminated body are subjected to this operation to thereby remove the first constraining layers 22a and 22b.

During this operation, water or water into which abrasive grains are dispersed is preferably sprayed while being accelerated by compressed gas obtained by compressing air. That is, water, abrasive grains, and compressed gas function synergistically to thereby remove the first constraining layers 22a and 22b.

The abrasive grains may preferably be at least one selected from the group consisting of alumina, silica, silicon carbide, boron carbide, zirconia, and boron nitride, for example. The abrasive grains preferably have an average grain diameter of several micrometers to several hundreds of micrometers, for example. Alternatively, instead of the water, alcohols, ketones, or other liquids may be used.

The first constraining layers 22a and 22b are removed by this method to thereby provide a ceramic body defined by the sintered base layer 20. Thus, a ceramic substrate is produced.

Alternatively, the first constraining layers 22a and 22b may be removed by a combination of the above-described methods to thereby produce the ceramic substrate.

Alternatively, all of the first to third constraining layers may be removed by the above-described methods without stripping off of the second constraining layers 24a, 24b and the third constraining layers 26a, 26b. In the first preferred embodiment, since the adhesion between the second constraining layers 24a, 24b and the first constraining layers 22a, 22b are relatively low, the second constraining layers 24a, 24b and the third constraining layers 26a, 26b can be easily removed by the above-described methods. As a result, the time required to remove all of the constraining layers is reduced.

The stripping off of the second constraining layers 24a and 24b and the third constraining layers 26a and 26b may be performed concurrently with the removal of the first constraining layers 22a and 22b by the above-described methods. For example, while the second constraining layers 24a and 24b and the third constraining layers 26a and 26b are stripped off, the first constraining layers 22a and 22b are removed by the ultrasonic radiation.

In the first preferred embodiment, even when the constraining layers are relatively thick in order to improve the constraining force, the constraining layers can be easily removed. Specifically, since the second constraining layers to be sintered by firing are sandwiched between the first constraining layers and the third constraining layers, the second constraining layers and the third constraining layers can be easily removed. For this reason, the thickness of the third constraining layers required to improve the constraining force can be appropriately selected.

Hereinafter, a method for producing a ceramic body according to a second preferred embodiment of the present invention will be described. A ceramic body produced by the second preferred embodiment has a configuration similar to that of the ceramic body produced by the first preferred embodiment.

A base layer, first constraining layers, second constraining layers, and third constraining layers are formed in a manner similar to that in the first preferred embodiment.

In the second preferred embodiment, the second constraining layers are formed such that the silica contents of the glass materials of the second constraining layers are preferably less than the silica content of the glass material of the base layer.

By increasing the content of a modifier oxide and decreasing the content of silica in a glass material, the softening point of the glass material is decreased. A decrease in the softening point of the glass material produces an earlier beginning of the permeation of the glass material and, thus, the amount of the glass material that has permeated after firing is increased. Such a modifier oxide is preferably, for example, an alkali metal oxide.

As in the first preferred embodiment, the step of preparing the laminated body of the base layer, the first constraining layers, the second constraining layers, and the third constraining layers; and the step of firing the laminated body are subsequently performed to produce a fired ceramic body.

The first, second, and third constraining layers are subsequently removed from the fired laminated body.

Figure 9:
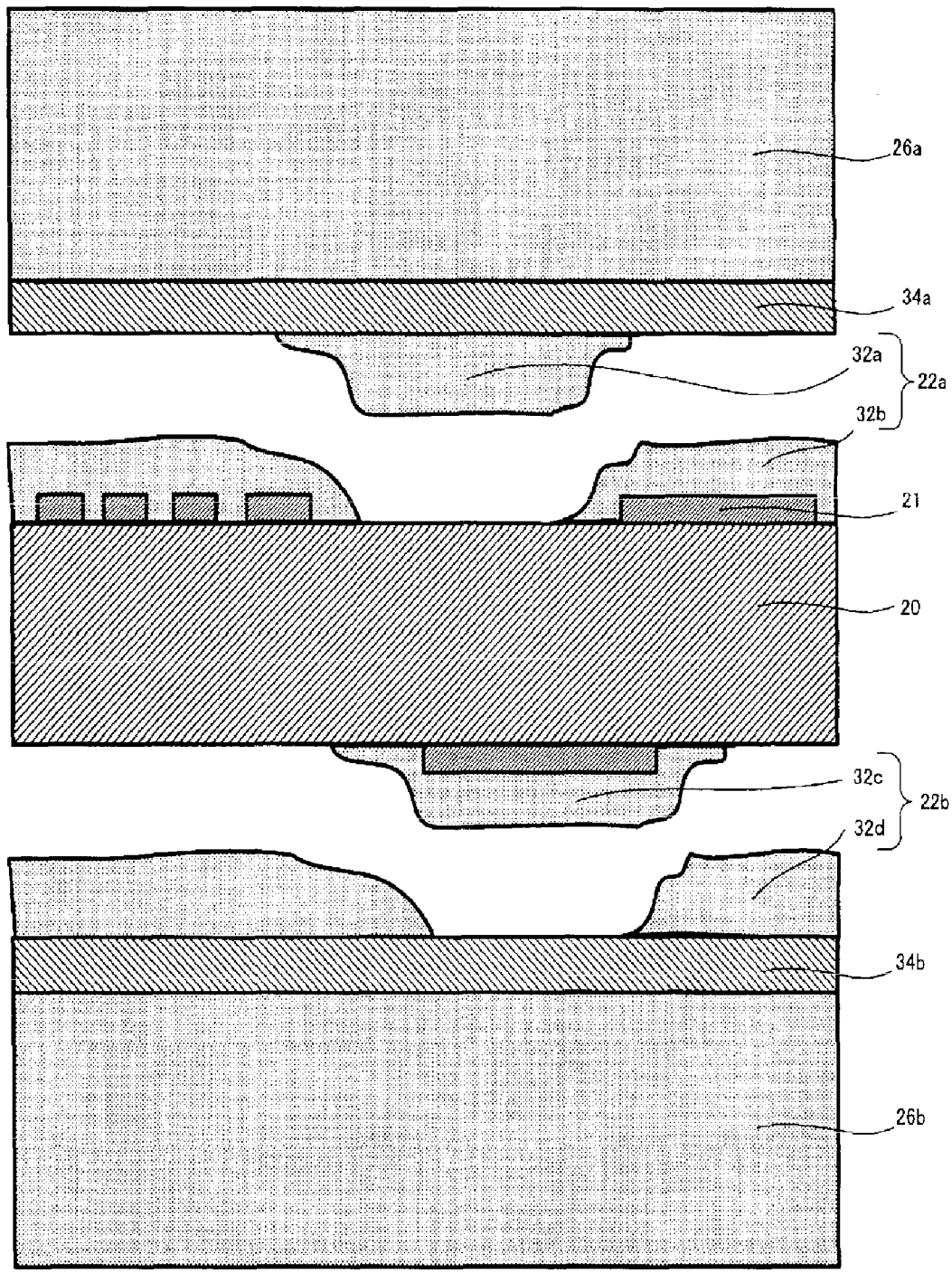
FIG. 9 is a schematic sectional view illustrating a step of removing constraining layers in a method for producing a ceramic body according to a second preferred embodiment of the present invention.

Referring to FIG. 9, after the firing, the second constraining layers 34a, 34b and the third constraining layers 26a, 26b are stripped off. At this time, the first constraining layers 22a, 22b are divided into portions 32b, 32c that remain on the base layer 20 and portions 32a, 32d that are bonded to the second constraining layers 34a, 34b and stripped off from the base layer 20.

The portions 32b and 32c that remain on the base layer correspond to portions at which the external conductors 21 are provided on the base layer 20. Since the diffusion of metal included in the external conductors 21 decreases the softening point of the glass material, permeation of the glass material into the first constraining layers 22a and 22b from the base layer 20 begins at a relatively early stage in the regions around the external conductors 21. For this reason, in the regions around the external conductors 21, the amount of the glass material that has permeated from the base layer 20 into the first constraining layers 22a and 22b is increased after firing. As a result, in the regions around the external conductors 21, reaction layers formed at the interfaces between the base layer 20 and the first constraining layers 22a, 22b are thicker than reaction layers formed at the interfaces between the second constraining layers 34a, 34b and the first constraining layers 22a, 22b. Specifically, in the regions around the external conductors 21, since the adhesion between the base layer 20 and the first constraining layers 22a, 22b is greater than the adhesion between the second constraining layers 34a, 34b and the first constraining layers 22a, 22b, the portions 32b, 32c that remain on the base layer 20 are produced from the first constraining layers 22a, 22b.

In contrast, the portions 32a, 32d that are bonded to and stripped off with the second constraining layers 34a, 34b are produced so as to correspond to regions at which the external conductor 21 is not formed on the base layer 20.

The silica content of the glass material of the base layer 20 is preferably greater than the silica contents of the glass materials of the second constraining layers 34a and 34b. An increase in the silica content of a glass material results in an increase in the softening point of the glass material. Accordingly, in the regions at which the external conductor 21 is not formed, the permeation of the glass material from the base layer 20 into the first constraining layers 22a and 22b begins later and the amount of the glass material that permeates is reduced. As a result, in the regions at which the external conductor 21 is not formed, the thicknesses of the reaction layers formed by firing at the interfaces between the base layer 20 and the first constraining layers 22a, 22b is less than the thicknesses of the reaction layers formed at the interfaces between the second constraining layers 34a, 34b and the first constraining layers 22a, 22b. Specifically, in the regions at which the external conductor 21 is not formed, since the adhesion between the base layer 20 and the first constraining layers 22a, 22b is less than the adhesion between the second constraining layers 34a, 34b and the first constraining layers 22a, 22b, the portions 32a, 32d that are stripped off with the second constraining layers 34a, 34b are produced.

The first constraining layers 32b and 32c that remain on the base layer 20 are then removed to provide a ceramic body defined by the sintered base layer 20. Thus, the ceramic body is produced. Specifically, the first constraining layers 32b and 32c that remain on the base layer 20 are removed in a manner similar to that in the first preferred embodiment.

In the second preferred embodiment, portions of the first constraining layers as well as the second and third constraining layers can be simultaneously stripped off, which further reduces the time required to remove the constraining layers.

Hereinafter, a method for producing a ceramic body according to a third preferred embodiment of the present invention will be described. A ceramic body produced by the third preferred embodiment has a configuration similar to that of the ceramic body produced by the first preferred embodiment.

A base layer, first constraining layers, second constraining layers, and third constraining layers are formed in a manner similar to that in the first preferred embodiment.

As in the first preferred embodiment, the step of preparing the laminated body of the base layer, the first constraining layers, the second constraining layers, and the third constraining layers; and the step of firing the laminated body are subsequently conducted to thereby produce a fired ceramic body.

Figure 10:
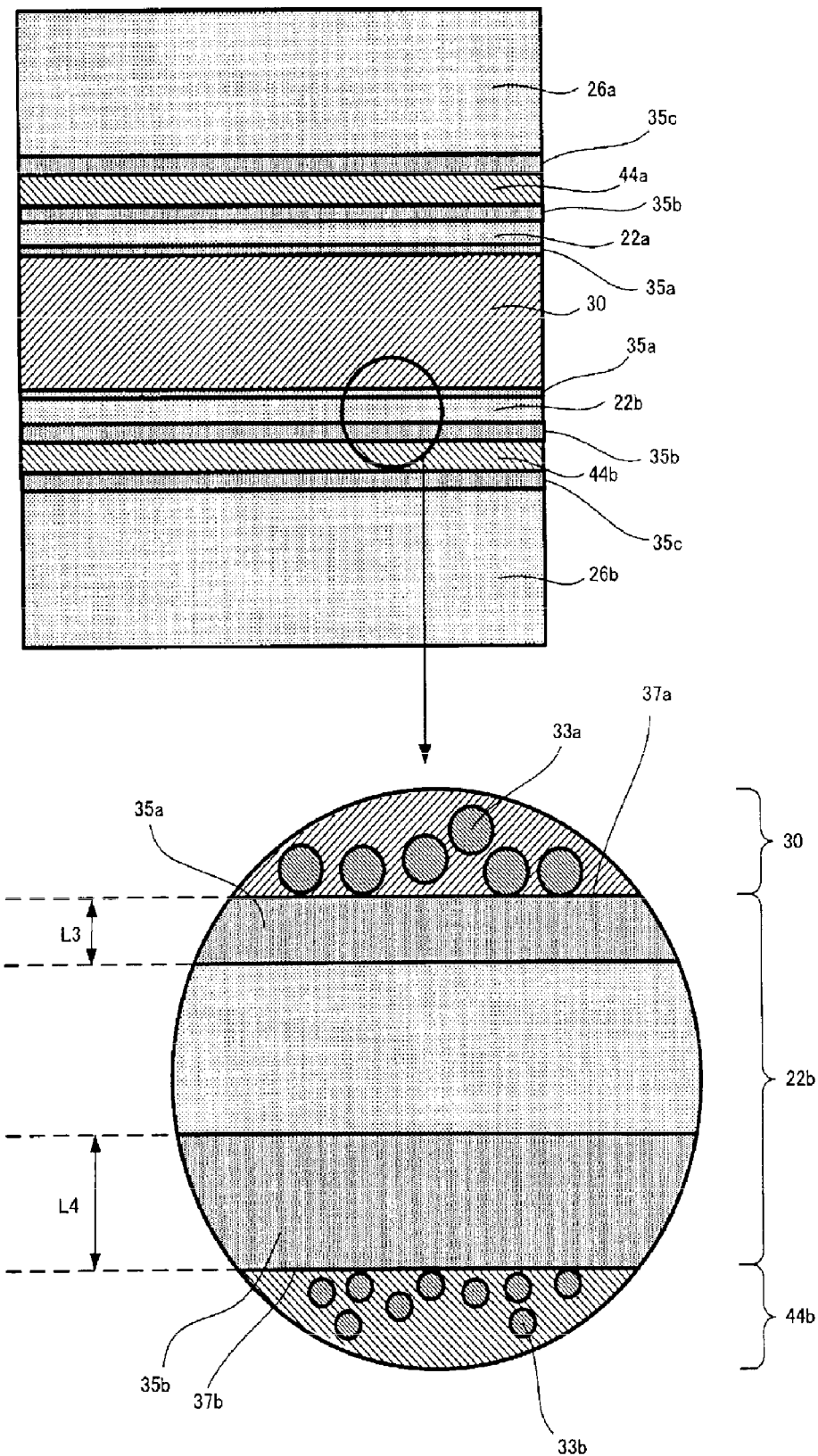
FIG. 10 is a schematic sectional view of a fired laminated body obtained by a method for producing a ceramic body according to a third preferred embodiment of the present invention, and an enlarged sectional view of a base layer, a first constraining layer, and a second constraining layer.

Referring to FIG. 10, in the third preferred embodiment, second constraining layers 44a and 44b are preferably formed with a ceramic material 33b having a smaller particle diameter than a ceramic material 33a included in a base layer 30. As the particle diameter of the ceramic material in the second constraining layers 44a and 44b decreases, the amount of the glass material that permeates into the first constraining layers 22a and 22b in firing increases. As a result, a thickness L3 of a reaction layer 35a formed by the firing at an interface 37a between the base layer 30 and the first constraining layer 22b is less than a thickness L4 of a reaction layer 35b formed at an interface 37b between the second constraining layer 44b and the first constraining layer 22b. In this case, after the firing, the adhesion between the base layer 30 and the first constraining layer 22b is less than the adhesion between the second constraining layer 44b and the first constraining layer 22b.

Since reaction layers 35c are also formed at the interfaces between the second constraining layers 44a, 44b and the third constraining layers 26a, 26b, the second constraining layers 44a, 44b and the third constraining layers 26a, 26b are bonded to each other. Note that, FIG. 10 illustrates the reaction layers as a model and, in actuality, boundaries between the reaction layers and other layers are not clearly defined.

The first, second, and third constraining layers are subsequently removed from the fired laminated body.

Figure 11:
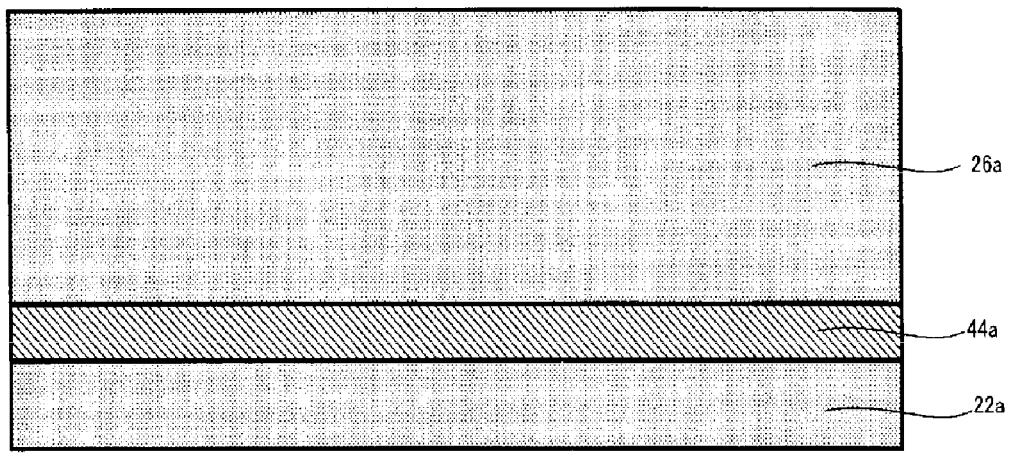
FIG. 11 is a schematic sectional view illustrating a step of removing constraining layers from the fired laminated body illustrated in FIG. 10.
Figure 11:
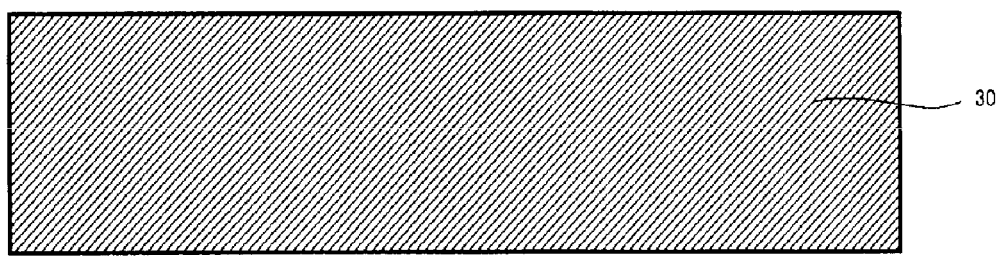
Figure 11:
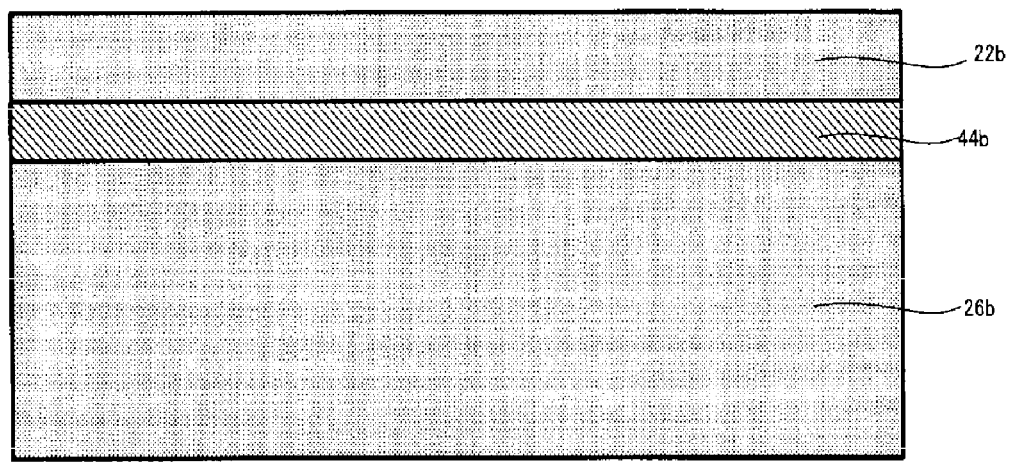
Figure 12:
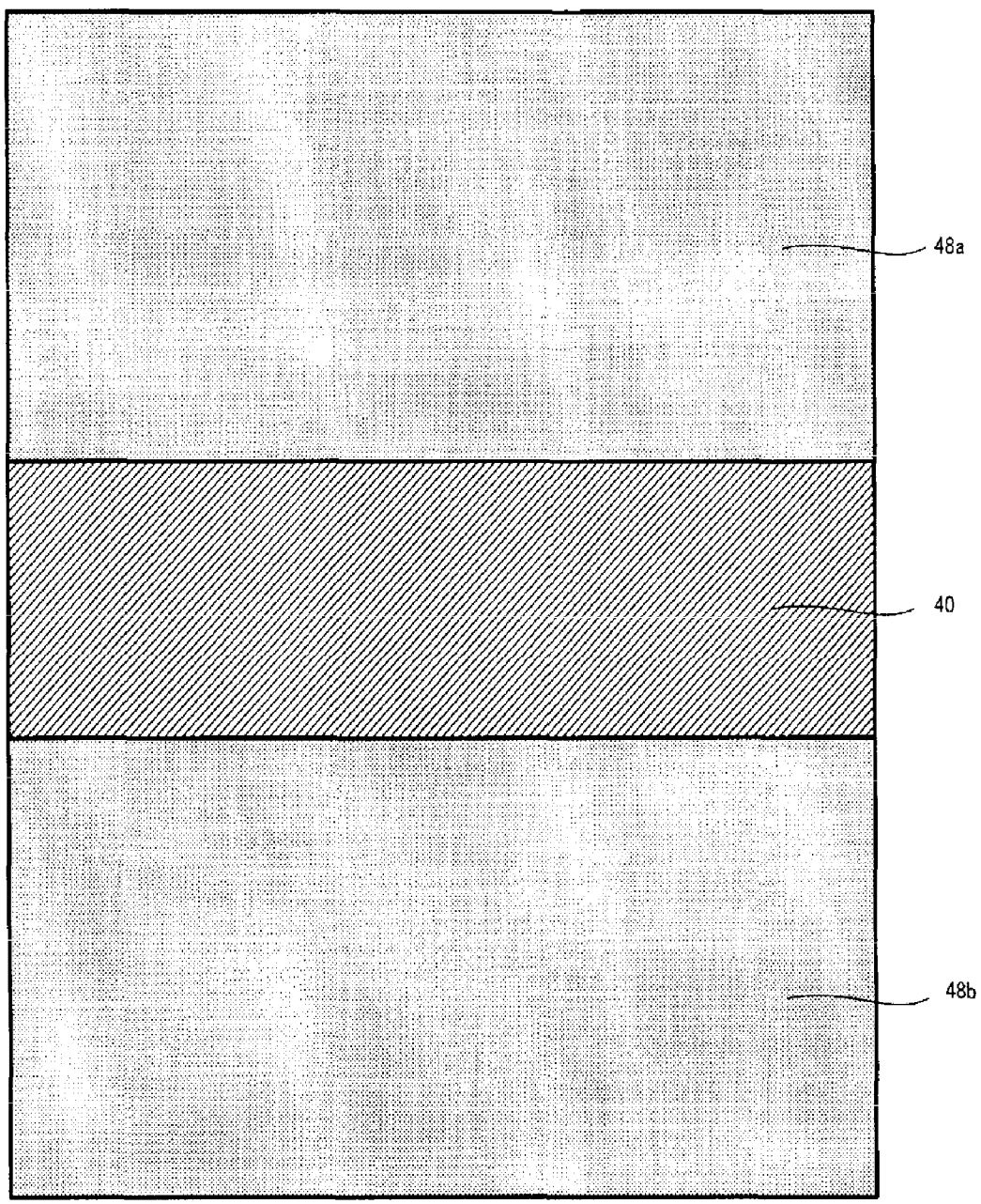
FIG. 12 is a schematic sectional view of a ceramic laminated body for illustrating an existing method for producing a ceramic body.

Referring to FIG. 11, after the firing, the first constraining layers 22a, 22b, the second constraining layers 44a, 44b, and the third constraining layers 26a, 26b can be simultaneously stripped off.

The reason why the base layer 30 and the first constraining layers 22a and 22b can be easily stripped off from each other is because after the firing, the adhesion between the second constraining layers 44a, 44b and the first constraining layers 22a, 22b are greater than the adhesion between the base layer 30 and the first constraining layers 22a, 22b.

In this manner, in the third preferred embodiment, the first constraining layers 22a and 22b, the second constraining layers 44a and 44b, and the third constraining layers 26a and 26b are removed from the laminated body to produce the a ceramic body defined by the sintered base layer 30. Thus, the ceramic body is produced.

There may be a case in which the ceramic body has a slight residue of the first constraining layers 22a and 22b after the removal of the first constraining layers 22a and 22b. In this case, the residue is removed in a manner similar to that in the first preferred embodiment.

Since the first, second, and third constraining layers are removed together in the third preferred embodiment, the time required to remove the constraining layers can be significantly reduced.

A method for producing a ceramic body according to preferred embodiments of the present invention is not restricted to the above-described preferred embodiments.

Specifically, to make the adhesion between a base layer and a first constraining layer and the adhesion between a second constraining layer and the first constraining layer different from each other after firing, for example, at least one of the following conditions is preferably selected.

The first condition is to make the content of a glass material in the base layer and the content of a glass material in the second constraining layer different from each other. Thus, the amount of the glass material that permeates from the base layer to the first constraining layer is different from the amount of the glass material that permeates from the second constraining layer to the first constraining layer. As a result, the thickness of a reaction layer formed by firing at the interface between the base layer and the first constraining layer is different from the thickness of a reaction layer formed by the firing at the interface between the second constraining layer and the first constraining layer. That is, after the firing, the adhesion between the base layer and the first constraining layer is different from the adhesion between the second constraining layer and the first constraining layer.

The second condition is to make the particle diameter of a ceramic material in the base layer and the particle diameter of a ceramic material in the second constraining layer different from each other. As the particle diameter of a ceramic material decreases, the amount of a glass material that permeates increases. As a result, the thickness of a reaction layer formed by firing at the interface between the base layer and the first constraining layer is different from the thickness of a reaction layer formed by the firing at the interface between the second constraining layer and the first constraining layer. That is, after the firing, the adhesion between the base layer and the first constraining layer and the adhesion between the second constraining layer and the first constraining layer are different from each other.

The third condition is to make the softening point of a glass material in the base layer and the softening point of a glass material in the second constraining layer different from each other. By making the softening points of the glass materials different between the base layer and the second constraining layer, temperatures at which the glass materials begin to permeate into the first constraining layer are different between the base layer and the second constraining layer. Thus, the amounts of the glass materials that have permeated after firing are different between the base layer and the second constraining layer. As a result, the thickness of a reaction layer formed by the firing at the interface between the base layer and the first constraining layer is different from the thickness of a reaction layer formed by the firing at the interface between the second constraining layer and the first constraining layer. That is, after the firing, the adhesion between the base layer and the first constraining layer and the adhesion between the second constraining layer and the first constraining layer are different from each other.

To make the softening point of a glass material in the base layer and the softening point of a glass material in the second constraining layer different from each other, for example, the silica content of the glass material in the base layer is preferably different from the silica content of the glass material in the second constraining layer.

To make the softening point of a glass material in the base layer and the softening point of a glass material in the second constraining layer different from each other, one or both of the base layer and the second constraining layer preferably include conductors. This is because conductors include metal materials that diffuse during firing to thereby decrease the softening points of glass materials. Accordingly, a glass material begins to permeate at a relatively early stage in a region including a conductor and, as a result, the amount of the glass material that permeates is relatively large in the region including a conductor. Even when both of the base layer and the second constraining layer include conductors, the above-described adhesion can be made different from each other by adjusting the positions or the formation densities of the conductors. For example, when a conductor is disposed close to a surface, the resultant adhesion is increased.

The fourth condition is to make the particle diameter of a glass material in the base layer and the particle diameter of a glass material in the second constraining layer different from each other. Thus, the amounts of the glass materials that permeate are different between the base layer and the second constraining layer. As a result, the thickness of a reaction layer formed by firing at the interface between the base layer and the first constraining layer is different from the thickness of a reaction layer formed by the firing at the interface between the second constraining layer and the first constraining layer. That is, after the firing, the adhesion between the base layer and the first constraining layer and the adhesion between the second constraining layer and the first constraining layer are different from each other.

The fifth condition is to form the first constraining layer from a plurality of green sheets and to make the particle diameter of a ceramic material in a green sheet in contact with the base layer and the particle diameter of a ceramic material in a green sheet in contact with the second constraining layer different from each other. As the particle diameter of a ceramic material in the first constraining layer decreases, the surface areas of the ceramic material for bonding to the glass material increase. Thus, after firing, the adhesion between the base layer and the first constraining layer and the adhesion between the second constraining layer and the first constraining layer are different from each other.

In a method for producing a ceramic body according to preferred embodiments of the present invention, the case in which, after firing, the adhesion between a base layer and a first constraining layer and the adhesion between a second constraining layer and the first constraining layer are different from each other is not restricted to the case in which the thickness of a reaction layer formed by firing at the interface between the base layer and the first constraining layer and the thickness of a reaction layer formed by the firing at the interface between the second constraining layer and the first constraining layer are different from each other. The case in which, after firing, the adhesion between a base layer and a first constraining layer and the adhesion between a second constraining layer and the first constraining layer are different from each other also preferably includes a case in which, though the reaction layers have the same thickness, the adhesions are different from each other due to the state of phases generated in the reaction layers, and specifically, the bonding states of components or the components of the generated phases in the reaction layers being different from each other.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A method for producing a ceramic body comprising:
    a step of preparing a laminated body including, in sequence,
        a base layer primarily made of a ceramic material and a glass material,
        a first constraining layer that is in contact with at least one of main surfaces of the base layer and is primarily made of a ceramic material that is not sintered at a temperature at which the base layer is sintered,
        a second constraining layer primarily made of a ceramic material and a glass material that are sintered at the temperature at which the base layer is sintered, and
        a third constraining layer primarily made of a ceramic material that is not sintered at the temperature at which the base layer is sintered;
    a step of firing the laminated body at the temperature at which the base layer is sintered; and
    a step of removing the first, second, and third constraining layers from the fired laminated body to provide a ceramic body defined by a sintered base layer; wherein
    after the firing, adhesion between the base layer and the first constraining layer and adhesion between the second constraining layer and the first constraining layer are different from each other.

2. The method for producing a ceramic body according to claim 1, wherein, as a result of the step of firing the laminated body, reaction layers are formed at an interface between the base layer and the first constraining layer and at an interface between the second constraining layer and the first constraining layer, and a thickness of the reaction layer formed at the interface between the base layer and the first constraining layer and a thickness of the reaction layer formed at the interface between the second constraining layer and the first constraining layer are different from each other.

3. The method for producing a ceramic body according to claim 1, wherein a content of the glass material in the base layer and a content of the glass material in the second constraining layer are different from each other.

4. The method for producing a ceramic body according to claim 1, wherein a particle diameter of the ceramic material in the base layer and a particle diameter of the ceramic material in the second constraining layer are different from each other.

5. The method for producing a ceramic body according to claim 1, wherein a softening point of the glass material in the base layer and a softening point of the glass material in the second constraining layer are different from each other.

6. The method for producing a ceramic body according to claim 5, wherein the glass materials of the base layer and the second constraining layer include silica, and a silica content of the glass material in the base layer and a silica content of the glass material in the second constraining layer are different from each other.

7. The method for producing a ceramic body according to claim 5, wherein at least one of the base layer and the second constraining layer includes a conductor.

8. The method for producing a ceramic body according to claim 7, wherein the conductor includes silver.

9. The method for producing a ceramic body according to claim 1, wherein the step of removing the first, second, and third constraining layers includes a step of simultaneously removing at least the second and third constraining layers.

10. The method for producing a ceramic body according to claim 1, wherein the ceramic body is a ceramic substrate.

* * * * *